(12) United States Patent
Ljungbro et al.

(10) Patent No.: US 12,745,343 B2
(45) Date of Patent: Sep. 22, 2026

(54) CARRIER SUBSTRATE, A METHOD, AND AN ELECTRONIC ASSEMBLY

(71) Applicant: Telefonaktiebolaget LM Ericsson (publ), Stockholm (SE)

(72) Inventors: Agneta Ljungbro, Bjärred (SE); Emil Nylander, Lund (SE); Per Ingelhag, Alingsås (SE); Tony Josefsson, Sandhult (SE); Torbjörn Dahl, Västra Frölunda (SE); Peter Melin, Lindome (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 205 days.

(21) Appl. No.: 18/705,669

(22) PCT Filed: Oct. 28, 2021

(86) PCT No.: PCT/SE2021/051082

§ 371 (c)(1), (2) Date: Apr. 29, 2024

(87) PCT Pub. No.: WO2023/075654

PCT Pub. Date: May 4, 2023

(65) Prior Publication Data

US 2025/0016908 A1 Jan. 9, 2025

(51) Int. Cl.
*H05K 1/02* (2006.01)
*H05K 1/11* (2006.01)
(Continued)

(52) U.S. Cl.
CPC ......... *H05K 1/0206* (2013.01); *H05K 1/0243* (2013.01); *H05K 1/115* (2013.01); (Continued)

(58) Field of Classification Search
CPC ..... H05K 1/0206; H05K 1/0243; H05K 1/181
(Continued)

(56) References Cited

U.S. PATENT DOCUMENTS 6,156,980 A 12/2000 Peugh et al.
6,292,366 B1 9/2001 Platt
(Continued)

FOREIGN PATENT DOCUMENTS

CA 2640519 A1 8/2007
CN 207305063 U 5/2018
(Continued)

OTHER PUBLICATIONS

Author Unknown, "At&S Enables "Cool" Designs for Miniaturized High-Power Application," Corporate News, Aug. 30, 2017, AT & S Austria Technologie, 4 pages.
(Continued)

*Primary Examiner* — Andargie M Aychillhum
(74) *Attorney, Agent, or Firm* — Withrow & Terranova, PLLC

(57) ABSTRACT

The present invention relates to a carrier substrate comprising thermal vias for thermally interconnecting components arranged on at least a first side of the carrier substrate to a heat pipe, wherein the carrier substrate further comprises a first substrate with thermal vias configured to be connected to a first component; a second substrate comprising a groove with a heat pipe; and wherein the first substrate is adhered to the second substrate by an adhesive, such that the heat pipe is embedded in said groove between the first substrate and the second substrate. The present invention also relates to an electronic assembly comprising such a carrier substrate.

19 Claims, 4 Drawing Sheets

(51) Int. Cl.

| | |
|---|---|
| ***H05K 1/14*** | (2006.01) |
| ***H05K 1/181*** | (2026.01) |
| ***H05K 3/38*** | (2006.01) |

(52) U.S. Cl.
CPC ............. *H05K 1/144* (2013.01); *H05K 1/181* (2013.01); *H05K 3/388* (2013.01); *H05K 2201/041* (2013.01); *H05K 2201/10098* (2013.01); *H05K 2201/10416* (2013.01)

(58) Field of Classification Search
USPC .......................................................... 174/250
See application file for complete search history.

(56) References Cited

U.S. PATENT DOCUMENTS

| | | | | |
|---|---|---|---|---|
| 9,545,017 | B2 | 1/2017 | Hunrath et al. | |
| 2003/0174484 | A1 | 9/2003 | Pai et al. | |
| 2005/0087356 | A1 | 4/2005 | Forcier | |
| 2006/0006525 | A1* | 1/2006 | Mullen | H05K 1/0206 257/796 |
| 2009/0065180 | A1 | 3/2009 | Wits et al. | |
| 2016/0091258 | A1 | 3/2016 | Ahamed et al. | |
| 2016/0204514 | A1 | 7/2016 | Miraftab et al. | |
| 2017/0167799 | A1* | 6/2017 | Silvano de Sousa | H05K 7/20336 |
| 2017/0229963 | A1* | 8/2017 | Zeng | H05K 1/0233 |
| 2017/0325327 | A1 | 11/2017 | Smith et al. | |
| 2018/0096912 | A1* | 4/2018 | de Sousa | H05K 1/0272 |

FOREIGN PATENT DOCUMENTS

| | | | |
|---|---|---|---|
| CN | 105938821 | B | 4/2020 |
| CN | 112218486 | B | 6/2021 |
| EP | 2053906 | A2 | 4/2009 |
| JP | H01265595 | A | 10/1989 |
| JP | H11233698 | A | 8/1999 |
| JP | 2004297093 | A | 10/2004 |
| JP | 2015012097 | A | 1/2015 |
| JP | 2015023065 | A | 2/2015 |
| KR | 20080051658 | A | 6/2008 |
| KR | 20120121357 | A | 11/2012 |
| WO | 2016151898 | A1 | 9/2016 |
| WO | 2020069727 | A1 | 4/2020 |
| WO | 2020150711 | A1 | 7/2020 |

OTHER PUBLICATIONS

Muthu, et al., "Embedded thermal management solution for power electronics PCB using additive manufacturing," Electronics Manufacturing and Technology, Asian Conference on Energy, Power, and Transportation, Oct. 23, 2017, IEEE, 6 pages.

Wits, Wessel, "Advances in Integrated Heat Pipe Technology for Printed Circuit Boards," International Conference on Environmental Systems, 2010, American Institute of Aeronautics and Astronautics, 11 pages.

International Search Report and Written Opinion for International Patent Application No. PCT/SE2021/051082, mailed Jun. 22, 2022, 11 pages.

Extended European Search Report for European Patent Application No. 21962668.6, mailed Jun. 23, 2025, 9 pages.

* cited by examiner 104
101
112
102
d
100
107
103
109
108
110
106
105
111

104
102
101
200
107
103
108
106
105
201

104
102
101
300
107
103
301
106
108
105
304

104
102
101
400
103
107
108
106
105
201
301
304

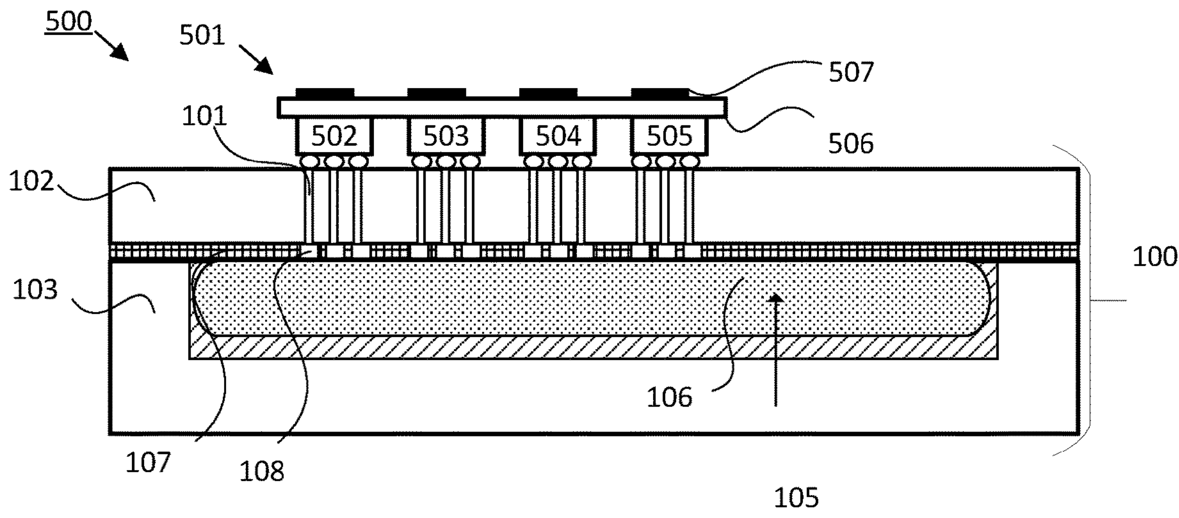
Fig. 5
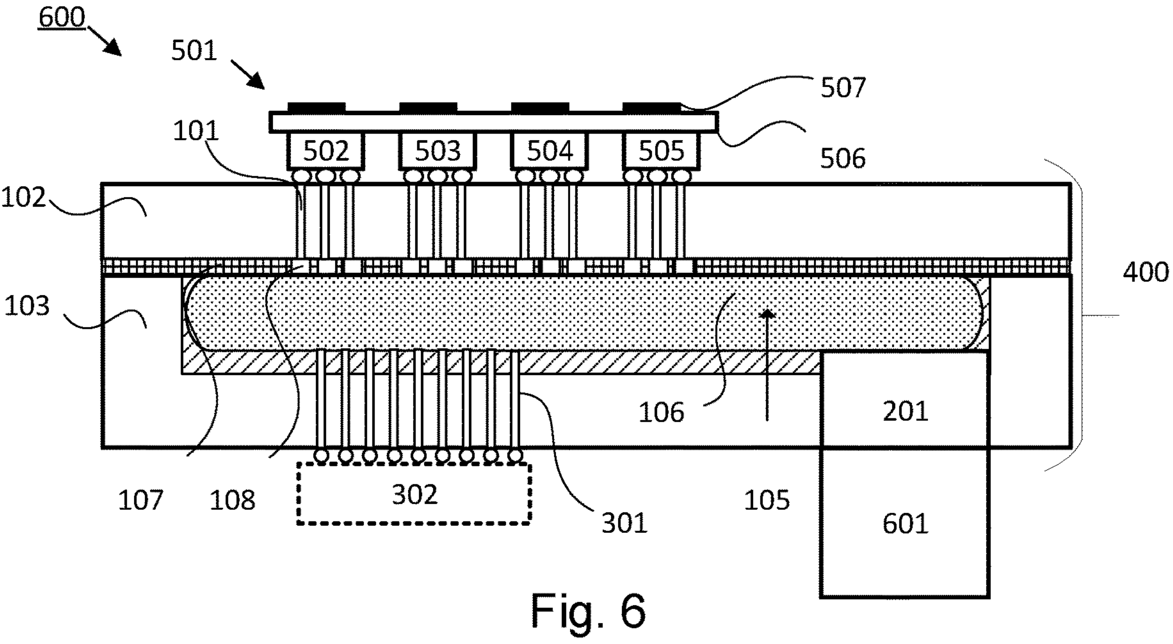
Fig. 6
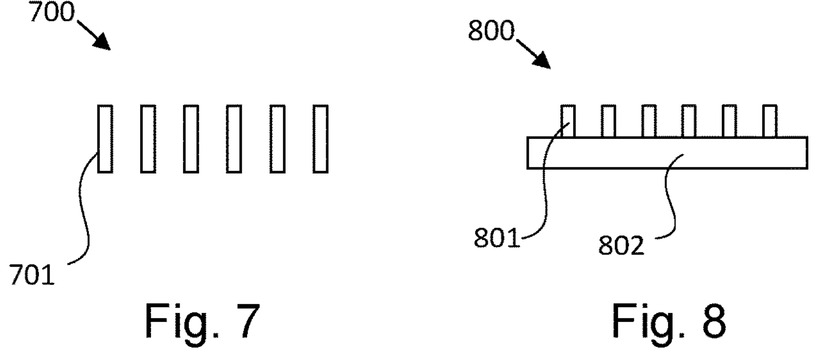
Fig. 7
Fig. 8

CARRIER SUBSTRATE, A METHOD, AND AN ELECTRONIC ASSEMBLY

This application is a 35 U.S.C. § 371 national phase filing of International Application No. PCT/SE2021/051082, filed Oct. 28, 2021, the disclosure of which is incorporated herein by reference in its entirety.

TECHNICAL FIELD

The present disclosure relates to a carrier substrate, a method and an electronic assembly. More particular, the invention relates to a carrier substrate with a heat pipe and thermal vias, and an electronic assembly having such a carrier substrate.

BACKGROUND

A carrier substrate is a substrate which connects and holds electronic components. In former times components were mounted using through holes and soldered either automatically or manually on a printed circuit board, PCB, which is an example of a carrier substrate. The next step in the evolution was the introduction of surface mounted components on the PCB. This allows a much higher density of components. Still, the circuit was essentially a 2D structure with a top plane and a bottom plane, and often the bottom plane was the ground plane. In order to further increase the integration of components more and more layers were added to the PCB. The next step in the evolution, was to arrange the components embedded in the PCB. This embedding causes significant heating of the embedded components, due to problems with cooling of the component embedded in the PCB. This is especially problematic if the embedded component is a power amplifier or an IC that requires large heat dissipation, such as a FPGA.

Thus, there is a need for a carrier substrate with improved heat dissipation that allows further densification of circuits.

SUMMARY

An object of the present disclosure is to provide a carrier substrate which seeks to mitigate, alleviate, or eliminate one or more of the above-identified deficiencies in the art and disadvantages singly or in any combination and to provide a carrier substrate capable of large heat dissipation.

Further objects and advantages may be found in the detailed description.

This object is obtained by a carrier substrate comprising thermal vias for thermally interconnecting components arranged on at least a first side of the carrier substrate to a heat pipe, wherein the carrier substrate further comprises a first substrate with thermal vias configured to be connected to a first component, a second substrate comprising a groove with a heat pipe, and wherein the first substrate is adhered to the second substrate by means of an adhesive, such that the heat pipe is embedded in said groove between the first substrate and the second substrate.

This object is also obtained by an electronic assembly, comprising a first component thermally connected to a first side of a carrier substrate according to embodiments.

An advantage of a carrier substrate with an embedded heat pipe that is configured to be thermally connected to a first component by means of thermal vias is that the first component may be embedded without a surface facing the open air, and still be provided efficient cooling by means of said thermal vias and the heat pipe.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

FIG. 5 illustrates in a cross-sectional view a first example of an improved electronic assembly;

FIG. 6 illustrates in a cross-sectional view a second example of an improved electronic assembly;

FIG. 7 illustrates an example of a heat spreader;

FIG. 8 illustrates a further example of a heat spreader;

DETAILED DESCRIPTION

Figures 1, 2, 3, 4:
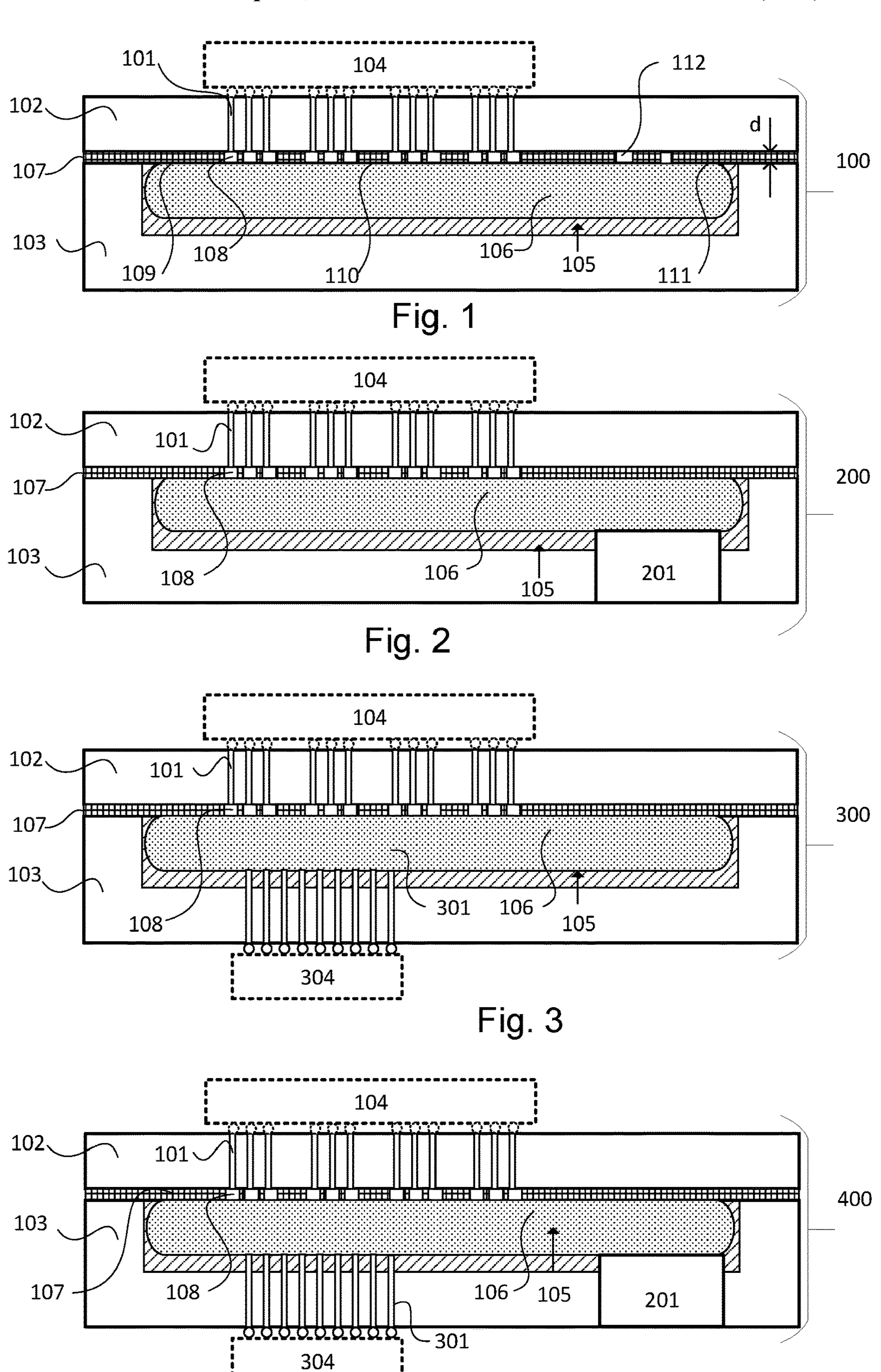
FIG. 1 illustrates in a cross-sectional view a first example of an improved carrier substrate.
FIG. 2 illustrates in a cross-sectional view a second example of an improved carrier substrate.
FIG. 3 illustrates in a cross-sectional view a third example of an improved carrier substrate.
FIG. 4 illustrates in a cross-sectional view a fourth example of an improved carrier substrate.

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms “a”, “an” and “the” are intended to include the plural forms as well, unless the context clearly indicates otherwise.

The term ‘via’ in this disclosure is intended to be interpreted as a vertical interconnect access, which is well known to the skilled person. Thus a thermal via is intended to be interpreted as vertical interconnect access for a thermal flow of heat. Accordingly a signal via is intended to be interpreted as a vertical interconnect access for an electric signal.

Some of the example embodiments presented herein are directed towards an improved carrier substrate and an improved electronic assembly that allows efficient heat dissipation. As part of the development of the example embodiments presented herein, a problem will first be identified and discussed.

In a dense electronic package several carrier substrates are often stacked on top of each other, and in some situations an electronic component may be completely embedded in the stack of carrier substrates. This prevents conventional cooling to be applied and in some cases the carrier substrate itself is used as a heat sink. This is of course not an ideal situation due to the risk of heating other components on the carrier substrate. It is well known in the art to use a heat pipe to transport heat from a component to a heat spreader which in turn is connected to a cooling device. In prior-art solutions attempts has been performed to integrate a heat pipe in a printed circuit board, PCB, which is an example of a carrier substrate. This integration is performed by laminating the PCB with the heat pipe embedded. The lamination process is associated with high pressure and often the heat pipe collapses under that pressure, and becomes permanently deformed which may have a detrimental effect on the possible heat flow in the heat pipe. This may have a detrimental effect on the efficiency of the circuit due to heating during operation of the PCB.

The present inventors have devised a solution for an improved carrier substrate and an electronic assembly having such an improved carrier substrate that mitigate, alleviate or eliminate the problem of collapsing heat pipes.

FIG. 1 shows a first example of a carrier substrate 100 comprising thermal vias 101 for thermally interconnecting components arranged on a first side of the carrier substrate 100 to a heat pipe 106. The carrier substrate further comprises a first substrate 102 with thermal vias 101 configured to be connected to a first component 104. The carrier substrate further comprises a second substrate 103 comprising a groove 105 with the heat pipe 106. This groove may for example be formed by milling the second substrate. The first substrate 102 is adhered to the second substrate 103 by means of an adhesive 107, such that the heat pipe 106 is embedded in said groove 105 between the first substrate 102 and the second substrate 103. The thermal via 101 is connected to the heat pipe 106 by means of sintering paste 108.

Since the lamination of the first substrate and the second substrate may be performed prior to inserting the heat pipe in the groove, the heat pipe is thus protected from the high pressure associated with conventional lamination.

According to some embodiments, the adhesive 107 is an epoxy adhesive. The adhesive 107 may be applied in a pattern of adhesive dots with air gaps between the dots. This allows air to escape from the interface between the first substrate 102 and the second substrate 103 during processing of the carrier substrate 100. The air gaps may also prove to be useful for air passage during operation of the carrier substrate in an electronic assembly.

According to some embodiments, the adhesive 107 comprises spacer elements 112 of a predetermined size d. This way the first carrier substrate 102 will be arranged at a predetermined distance d from said second substrate 103. Furthermore, this causes the carrier substrate 100 to be of a constant thickness. In particular, the first substrate 102 will be parallel with the second substrate 103, which is advantageous during manufacturing.

According to some embodiments, the thermal vias 101 are connected to a region 110 in between a first edge region 109 and a second edge region 111 of the heat pipe 106. This way efficient heat flow from the thermal vias 101 to the heat pipe 106 is assured.

Figures 9, 10, 11:
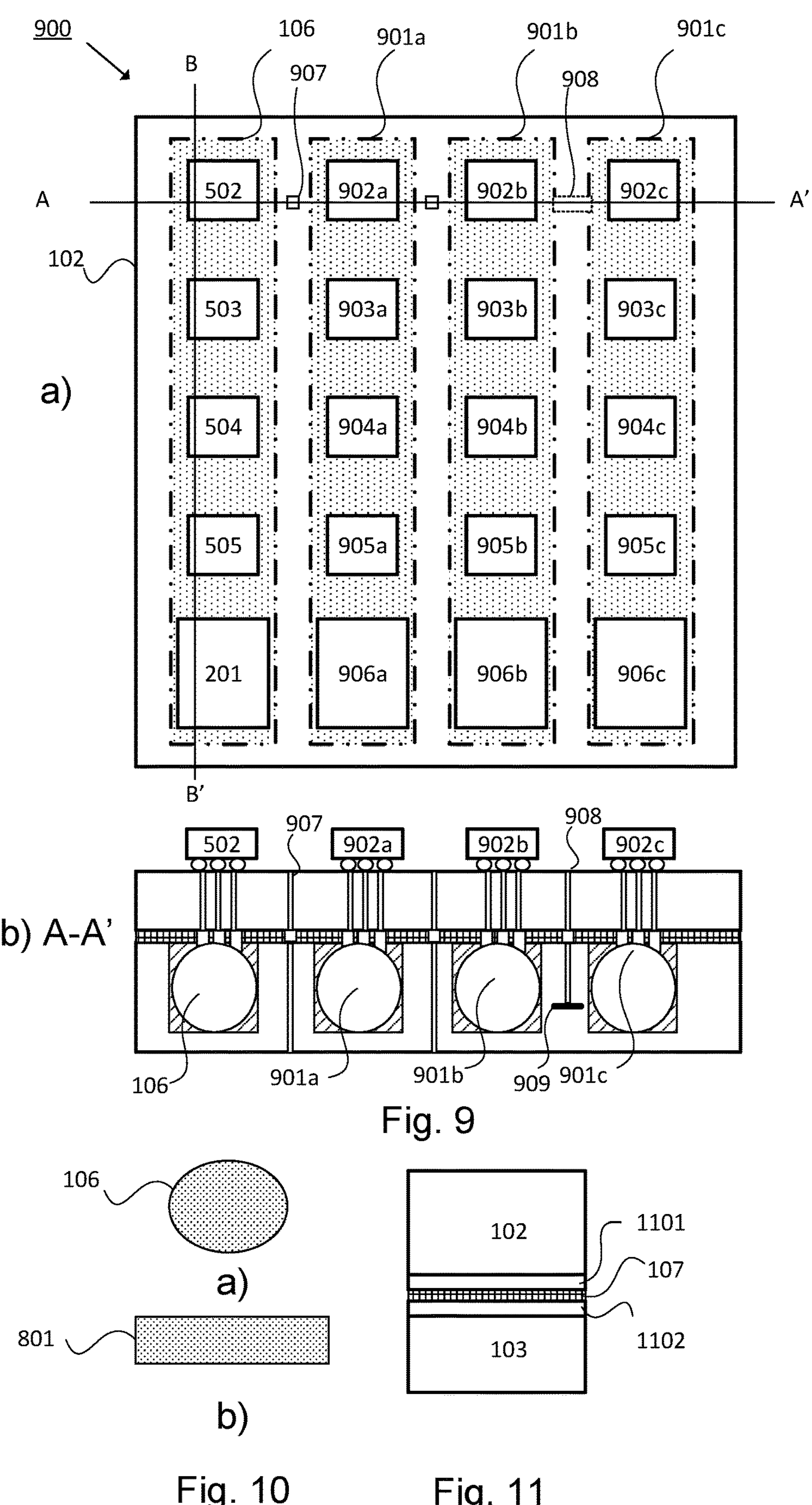
FIG. 9 illustrates in a) a top view of an improved carrier substrate, and in b) a cross-sectional view along slice A-A' is illustrated.
FIG. 10 illustrates examples of different cross-sectional profiles of heat pipes.
FIG. 11 illustrates a cross-sectional view of an embodiment of a carrier substrate.

According to some embodiments, the heat pipe 106 comprises a circular cross-section in order to further prevent the heat pipe from collapsing during manufacturing. The round cross-section provides increased structural toughness. Such heat pipes with rounded corners in a cross-sectional view is illustrated in FIG. 10 a) which shows a heat pipe 106 with rounded corners. In FIG. 10 b) is a conventional heat pipe illustrated.

According to some embodiments, the heat pipe 106 is laminated in the groove 105 by means of prepreg, or sintering paste. Prepreg (pre-impregnated) is one of the main materials used in multilayered carrier substrates and is what holds the carrier substrates together. It is composed of fiberglass impregnated with resin (an epoxy-based material). Once heated, the prepreg holds the core of the PCB and the layers together.

FIG. 2 illustrates a second example of a carrier substrate 100, which differs from the first example disclosed with reference made to FIG. 1 in that the second substrate 103 comprises a heat spreader, generally designated 201, connected to said heat pipe 106. This way a cooling device may be thermally connected to the heat spreader which allows for efficient heat flow from the heat pipe to the cooling device.

FIG. 7 discloses an example of a heat spreader 700 comprising a farm of thermal vias 701. Within the art, the term 'farm of thermal vias' is known to describe an arrangement with thermal vias arranged in pattern with a defined density and distribution.

FIG. 8 discloses a heat spreader 800 comprising a coin 802, which is a metal plate, often made of copper, connected to the heat pipe via thermal vias 801. The coin 802 is easily thermally connected to a cooling device.

FIG. 3 illustrates in a cross-sectional view a third example of an improved carrier substrate 300 which differs from the first example disclosed with reference made to FIG. 1 in that the second substrate 103 comprises further thermal vias 301. The further thermal vias 301 are connected to the heat pipe 106 and wherein the further thermal vias 301 are configured to be connected to a second component 302 arranged on the second substrate 103 and on an opposing side of the carrier substrate relative the first component 104.

FIG. 4 illustrates a fourth example of an improved carrier substrate 400. This fourth example differs from the third example disclosed with reference made to FIG. 3 in that the second substrate 103 further comprises a heat spreader 201 thermally connected to the heat pipe 106 (as disclosed in the second example discussed with reference made to FIG. 2). The heat spreader 201 acts as a heat sink for the heat pipe 106. The heat spreader 201 may be arranged remote from the first component 104 and the second component 304.

In some embodiments, the first substrate 102, and/or the second substrate 103 comprises at least two layers electrically connected to each other by means of electrical vias for signal and power distribution.

FIG. 11 illustrates a cross-sectional view of an embodiment of a carrier substrate. The first substrate 102 comprises a conducting layer 1101 facing the second substrate 103, and wherein the second substrate 103 comprises a further conducting layer 1102 facing the conducting layer 1101 of the first substrate 102 with an intermediate layer of adhesive 107. This allows two conducting layers to face each other in the carrier substrate while electric isolation between the conducting layers may be maintained.

FIG. 5 illustrates in a cross-sectional view a first example of an improved electronic assembly, generally designated 500. The electronic assembly 500, comprises a first component 501 thermally connected to a first side of a carrier substrate 100 according to examples disclosed herein.

The first component 501 comprises a further carrier substrate 506 on which circuits 502,503,504,505 are arranged on a first side, such that the circuits 502,503,504,

505 are located between the first side of the carrier substrate 100 and the first side of the further carrier substrate 506.

A second side opposite the first side of the further carrier substrate 506 comprises a wave guide structure 507. The further carrier substrate 506 is an antenna substrate, or a substrate for microwave circuits, and the wave guide structure 507 of the further carrier substrate 506 comprises at least one antenna. This way the further carrier substrate only contains antennas and wave guides and no routing of power and signals through the substrate is necessary, which is beneficial both from a cost perspective and a RF perspective.

FIG. 6 illustrates in a cross-sectional view a second example of an improved electronic assembly, generally designated 600. The second example of an improved electronic assembly 600 differs from the first example of an improved electronic assembly 500 disclosed above with reference made to FIG. 5 in that the electronic assembly 600 comprises a second component 302 arranged on a second side of the carrier substrate 400, opposite of the first side of the carrier substrate 400. The second component 302 is thermally connected to the heat pipe 106 by means of further thermal vias 301. The second example of an improved electronic assembly 600 is also provided a cooling device 601 acting as a heat sink for the heat pipe 106. The cooling device 601 may be a liquid cooler, or a heat sink that may be provided a fan.

FIG. 9*a* illustrates a top view of an improved electronic assembly 900 with a carrier substrate according to embodiments herein. In the top view the heat pipe 106 is illustrated as a hidden rectangle. The top view also discloses a plurality of further heat pipes 901*a*,901*b*,901*c* arranged besides the heat pipe 106. Each of the heat pipes is connected to an associated heat spreader 201,906*a-c*. The top view also reveals further circuits 902*a*-906*a*,902*b*-906*b*,902*c*-906*c* connected to associated further heat pipes 901*a*,901*b*,901*c*. The space between the heat pipes may be used for electrical vias 907 that connects circuits and components arranged on opposite sides of the carrier substrate. These electrical vias 907 are shown in a cross-sectional view A-A' of the carrier substrate in FIG. 9*b*. This allows electrical connection between opposite sides of the carrier substrate. Optionally, an electrical via 908 may end within a substrate to connect to a laminated layer 909 therein.

Figure 12:
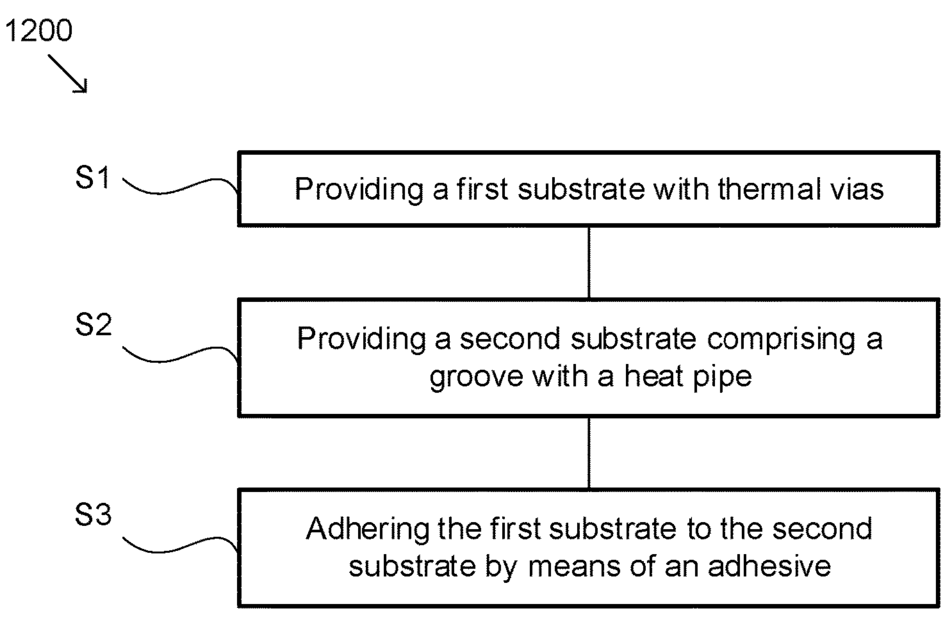
FIG. 12 is a flowchart illustrating a method according to the present disclosure.

FIG. 12 is a flowchart illustrating a method, generally designated 1200, of producing a carrier substrate 100;200;300;400 comprising thermal vias 101 for thermally interconnecting components arranged on at least a first side of the carrier substrate 100 to a heat pipe 106.

The method is started in step S1 of providing a first substrate 102 with thermal vias 101 configured to be connected to a first component 104.

The method continues in step S2 of providing a second substrate 103 comprising a groove 105 with a heat pipe 106.

Finally in step S3 the first substrate 102 is adhered to the second substrate 103 by means of an adhesive 107, such that the heat pipe 106 is embedded in said groove 105 between the first substrate 102 and the second substrate 103.

Optionally, the method further comprises the step of connecting the thermal vias of the first substrate to the heat pipe of the second substrate by means of a sintering paste.

Figure 13:
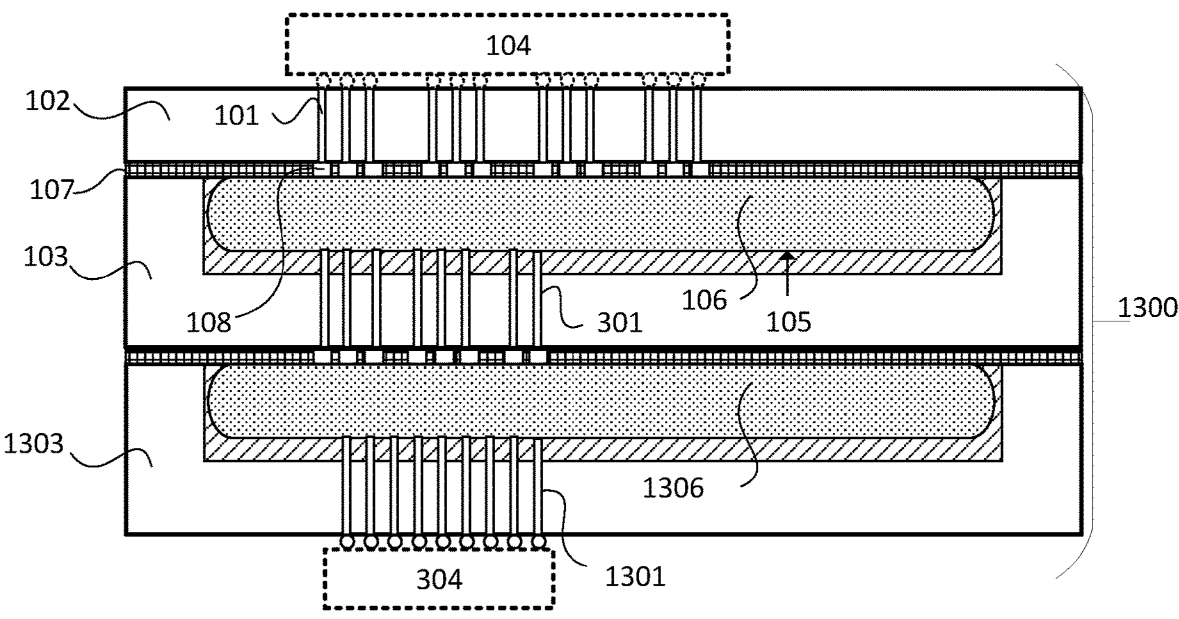
FIG. 13 illustrates in cross-sectional view an example of an improved carrier substrate, according to an embodiment.

In FIG. 13 an example of a carrier board 1300 is disclosed. The carrier board 1300 differs from the carrier board 300 of the third example disclosed with reference made to FIG. 3 in that a further second substrate 1303 is laminated to the second substrate 103. The heat pipe 106 of the second substrate 103 is connected by means of vias 301 to the further heat pipe 1306 of the further second substrate 1303. This allows efficient heat flow from a first component 104 and a second component 304, wherein the second component 304 is connected to the further heat pipe 1306 by means of further thermal vias 1301.

This disclosure relates to a carrier substrate comprising thermal vias for thermally interconnecting components arranged on at least a first side of the carrier substrate to a heat pipe, wherein the carrier substrate further comprises a first substrate with thermal vias configured to be connected to a first component, a second substrate comprising a groove with a heat pipe, and wherein the first substrate is adhered to the second substrate by means of an adhesive, such that the heat pipe is embedded in said groove between the first substrate and the second substrate.

According to some embodiments, the thermal vias of the first substrate are connected to the heat pipe of the second substrate by means of a sintering paste.

According to some embodiments, the adhesive comprises spacer elements of a predetermined size.

According to some embodiments, the thermal vias are connected to a region in between a first edge region and a second edge region of the heat pipe.

According to some embodiments, the heat pipe comprises a circular cross-section.

According to some embodiments, the heat pipe is laminated in the groove by means of prepreg, or sintering paste.

According to some embodiments, the second substrate further comprises a heat spreader connected to said heat pipe.

According to some embodiments, the second substrate comprises further thermal vias connected to the heat pipe and wherein the further thermal vias are configured to be connected a second component arranged on an opposing side to the first component.

According to some embodiments, the first substrate, and/or the second substrate comprises at least two layers electrically connected to each other by means of vias for signal and power distribution.

According to some embodiments, the first substrate comprises a conducting layer facing the second substrate, and wherein the second substrate comprises a further conducting layer facing the conducting layer of the first substrate.

This disclosure relates to an electronic assembly, comprising: a first component thermally connected to a first side of a carrier substrate according to embodiments.

According to some embodiments, the electronic assembly further comprises: a second component arranged on a second side of the carrier substrate opposite the first side of the carrier substrate.

According to some embodiments, the first component comprises a further carrier substrate on which circuits are arranged on a first side, such that the circuits are located between the first carrier substrate and the first side of the further carrier substrate.

According to some embodiments, a second side of the further carrier substrate comprises a wave guide structure, and the first side of the further carrier substrate is opposite said second side of the further carrier substrate.

According to some embodiments, the further carrier substrate is an antenna substrate and the wave guide structure of the further carrier substrate comprises at least one antenna.

According to some embodiments, the heat spreader is connected to a cooling device.

This disclosure also relates to a method of producing a carrier substrate comprising thermal vias for thermally interconnecting components arranged on at least a first side of the carrier substrate to a heat pipe, wherein the method comprises the steps of providing a first substrate with thermal vias configured to be connected to a first component, providing a second substrate comprising a groove with a heat pipe, and adhering the first substrate to the second substrate by means of an adhesive, such that the heat pipe is embedded in said groove between the first substrate and the second substrate.

According to some embodiments, the method further comprises the step of connecting the thermal vias of the first substrate to the heat pipe of the second substrate by means of a sintering paste.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products.

It should be appreciated that the example embodiments presented herein may be practiced in any combination with each other. It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The embodiments of this disclosure are especially useful in modern telecom systems such as advanced antenna systems (AAS), which are a crucial part of all existing and emerging telecom solutions (5G/6G).

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A carrier substrate comprising thermal vias for thermally interconnecting components arranged on at least a first side of the carrier substrate to a heat pipe, wherein the carrier substrate further comprises:

a first substrate with thermal vias configured to be connected to a first component;

a second substrate comprising a groove with a heat pipe; and wherein the first substrate is adhered to the second substrate an adhesive, wherein the adhesive comprises spacer elements of a predetermined width (d) such that the space between the first substrate and the second substrate is maintained at width (d), such that the heat pipe is embedded in said groove between the first substrate and the second substrate.

2. The carrier substrate according to claim 1, wherein. the thermal vias of the first substrate are connected to the heat pipe of the second substrate by a sintering paste.

3. The carrier substrate according to claim 1, wherein the adhesive is an epoxy adhesive.

4. The carrier substrate according to claim 1, wherein the thermal vias are connected to a region in between a first edge region and a second edge region of the heat pipe.

5. The carrier substrate according to claim 1, wherein a cross-section of the heat pipe is circular.

6. The carrier substrate according to claim 1, wherein the heat pipe is laminated in the groove by prepreg, or sintering paste.

7. The carrier substrate according to claim 1, wherein the second substrate further comprises a heat spreader connected to said heat pipe.

8. The carrier substrate according to claim 1, wherein the second substrate comprises further thermal vias connected to the heat pipe and wherein the further thermal vias are configured to be connected a second component arranged on an opposing side to the first component.

9. The carrier substrate according to claim 1, wherein the first substrate, and/or the second substrate comprises at least two layers electrically connected to each other vias for signal and power distribution.

10. The carrier substrate according to claim 1, wherein the first substrate comprises a conducting layer facing the second substrate, and wherein the second substrate comprises a further conducting layer facing the conducting layer of the first substrate.

11. An electronic assembly, comprising a first component thermally connected to at least a first side of a carrier substrate, which comprises:

thermal vias for thermally interconnecting components arranged on at least a first side of the carrier substrate to a heat pipe, wherein the carrier substrate further comprises:

a first substrate with thermal vias configured to be connected to a first component;

a second substrate comprising a groove with a heat pipe; and wherein the first substrate is adhered to the second substrate by an adhesive, wherein the adhesive comprises spacer elements of a predetermined width (d) such that the space between the first substrate and the second substrate is maintained at width (d), such that the heat pipe is embedded in said groove between the first substrate and the second substrate.

12. The electronic assembly according to claim 11, comprising a second component arranged on a second side of the carrier substrate, opposite of the first side of the carrier substrate.

13. The electronic assembly according to claim 12, wherein the second component is thermally connected to said heat pipe by further thermal vias.

14. The electronic assembly according to claim 11, wherein the first component comprises:

a further carrier substrate on which circuits are arranged on a first side, such that the circuits are located between the first carrier substrate and the first side of the further carrier substrate.

15. The electronic assembly according to claim 14, wherein a second side of the further carrier substrate comprises a wave guide structure; and the first side of the further carrier substrate is opposite said second side of the further carrier substrate.

16. The electronic assembly according to claim 15, wherein the further carrier substrate is an antenna substrate and the wave guide structure of the further carrier substrate comprises at least one antenna.

17. The electronic assembly according to claim 11, wherein the heat spreader is connected to a cooling device.

18. A method of producing a carrier substrate comprising thermal vias for thermally interconnecting components arranged on at least a first side of the carrier substrate to a heat pipe, wherein the method comprises the steps of:

providing a first substrate with thermal vias configured to be connected to a first component;

providing a second substrate comprising a groove with a heat pipe; and adhering the first substrate to the second substrate an adhesive, wherein the adhesive comprises spacer elements of a predetermined width (d) such that the space between the first substrate and the second substrate is maintained at width (d), such that the heat pipe is embedded in said groove between the first substrate and the second substrate.

19. The method according to claim 18, further comprising the step of:

connecting the thermal vias of the first substrate to the heat pipe of the second substrate by a sintering paste.

* * * * *